United States Patent
Takasaki

(10) Patent No.: US 12,165,855 B2
(45) Date of Patent: Dec. 10, 2024

(54) CERAMIC HEATER

(71) Applicant: NGK INSULATORS, LTD., Nagoya (JP)

(72) Inventor: Hideaki Takasaki, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 766 days.

(21) Appl. No.: 17/445,332

(22) Filed: Aug. 18, 2021

(65) Prior Publication Data

US 2021/0384014 A1    Dec. 9, 2021

Related U.S. Application Data

(63) Continuation of application No. PCT/JP2020/009188, filed on Mar. 4, 2020.

(30) Foreign Application Priority Data

Mar. 18, 2019    (JP) ................. 2019-049548

(51) Int. Cl.
    *H01J 37/32*      (2006.01)
    *H05B 3/28*      (2006.01)

(52) U.S. Cl.
    CPC ........ *H01J 37/32724* (2013.01); *H05B 3/283* (2013.01); *H01J 2237/3321* (2013.01)

(58) Field of Classification Search
    CPC ........ H05B 2203/013; H05B 2203/026; H05B 2203/017; H05B 2203/032; H05B 3/141;
(Continued)

(56) References Cited

U.S. PATENT DOCUMENTS 6,204,489 B1    3/2001    Katsuda et al.
6,215,643 B1    4/2001    Nagasaki
(Continued)

FOREIGN PATENT DOCUMENTS

CN     101067996 A     11/2007
JP     H11-260534 A     9/1999
(Continued)

OTHER PUBLICATIONS

Korean Notice of Third Party Submission (Application No. 10-2021-7028960) dated Sep. 7, 2023 (10 pages).
(Continued)

*Primary Examiner* — Vy T Nguyen
(74) *Attorney, Agent, or Firm* — BURR PATENT LAW, PLLC

(57) ABSTRACT

A ceramic heater includes an AlN ceramic substrate having a wafer placement surface in which, from a position closer to the wafer placement surface, a plasma-generation RF electrode and a heater electrode are embedded in this order so as to be separated from each other. The AlN ceramic substrate includes an AlN ceramic high-resistivity layer disposed between the RF electrode and the heater electrode, and an AlN ceramic low-resistivity layer other than the high-resistivity layer. The high-resistivity layer and the low-resistivity layer each contain Si, Mg, and Ti. The high-resistivity layer has higher Mg and Ti contents and a higher volume resistivity than the low-resistivity layer.

7 Claims, 3 Drawing Sheets

(58) Field of Classification Search
CPC ........ H05B 3/143; H05B 3/265; H05B 3/267;
H05B 3/283; H05B 3/34; H05B
2203/006; H05B 2203/019; H05B
2203/029; H05B 2203/036; H05B
2214/02; H05B 3/0095; H05B 3/06;
H05B 3/08; H05B 3/26; H05B 3/262;
H05B 3/68; H05B 3/84; H05B 3/845;
C23C 16/0245; C23C 16/0272; C23C
16/26; C23C 4/073; C23C 4/10; H01L
21/683; H01L 21/6833; H01L 21/02;
H01L 21/31; H01L 21/6831
USPC ......... 219/213, 444; 392/407; 361/234, 230;
29/611; 165/46; 428/216, 336, 408, 457
See application file for complete search history.

(56) References Cited

U.S. PATENT DOCUMENTS

| | | | |
|---|---|---|---|
| 7,929,269 B2* | 4/2011 | Rusinko, Jr. | .......... H01L 21/683 |
| | | | 361/230 |
| 11,508,586 B2 | 11/2022 | Chae et al. | |
| 2007/0215596 A1 | 9/2007 | Wintenberger et al. | |
| 2007/0221649 A1 | 9/2007 | Ohta et al. | |
| 2011/0188838 A1* | 8/2011 | Abbott | .................... H05B 3/34 |
| | | | 392/407 |
| 2014/0285943 A1* | 9/2014 | Watanabe | ........... H01L 21/6833 |
| | | | 361/234 |
| 2016/0155562 A1 | 6/2016 | Hirose et al. | |
| 2019/0244847 A1 | 8/2019 | Yamana et al. | |

FOREIGN PATENT DOCUMENTS

| | | | |
|---|---|---|---|
| JP | 2000-077508 | A | 3/2000 |
| JP | 3602908 | B2 | 12/2004 |
| JP | 2006-060040 | A | 3/2006 |
| JP | 2007-258609 | A | 10/2007 |
| JP | 2010-177698 | A | 8/2010 |
| JP | 2015-030634 | A | 2/2015 |
| JP | 6393006 | B1 | 9/2018 |
| WO | 2015/025589 | A1 | 2/2015 |
| WO | 2019/004589 | A1 | 1/2019 |

OTHER PUBLICATIONS

International Search Report and Written Opinion (Application No. PCT/JP2020/009188) dated Jun. 9, 2020.
Taiwanese Office Action (Application No. 109107653) dated Oct. 15, 2020.
English translation of the International Preliminary Report on Patentability (Chapter I) dated Sep. 30, 2021 (Application No. PCT/JP2020/009188).
Chinese Office Action (with English translation) dated Jun. 7, 2024 (Application No. 202080021382.X).

* cited by examiner

CERAMIC HEATER

BACKGROUND OF THE INVENTION

1. Field of the Invention

The present invention relates to a ceramic heater.

2. Description of the Related Art

Existing semiconductor manufacturing processes employ a plasma CVD step in some cases. In the plasma CVD step, a wafer is placed on the wafer placement surface of a ceramic heater. In the ceramic substrate of the ceramic heater, a plasma-generation electrode and a heater electrode are embedded. On the other hand, in the space above the wafer, an upper electrode is disposed. Application of a high-frequency voltage between the upper electrode and the plasma-generation electrode causes generation of plasma between these electrodes; this plasma is used to achieve vapor deposition of a thin film on the wafer. In such a ceramic heater, when a leakage current due to the high-frequency voltage applied to the plasma-generation electrode reaches the heater electrode, the passage of a current through the heater electrode becomes uncontrollable, which has been problematic. For this point, Patent Literature 1 has proposed a high-resistivity insulating layer (leakage-current prevention layer) disposed between the plasma-generation electrode and the heater electrode. In addition, it has proposed an example in which the ceramic substrate itself is formed of aluminum nitride ceramic, and the insulating layer is formed of silicon nitride ceramic having a higher resistivity than aluminum nitride.

CITATION LIST

Patent Literature

PTL 1: JP 3602908 B

SUMMARY OF THE INVENTION

However, since silicon nitride ceramic has a thermal expansion coefficient that is only about 60% of the thermal expansion coefficient of aluminum nitride ceramic, repeated increase and decrease in the temperature of the ceramic heater may cause separation of the insulating layer.

The present invention has been made in order to address such a problem and a main object thereof is to prevent the leakage current between the plasma-generation electrode and the heater electrode for a long term.

A ceramic heater according to the present invention includes an AlN ceramic substrate having a wafer placement surface in which, from a position closer to the wafer placement surface, a plasma-generation electrode and a heater electrode are embedded in this order so as to be separated from each other, wherein the AlN ceramic substrate includes
an AlN ceramic high-resistivity layer disposed between the plasma-generation electrode and the heater electrode, and
an AlN ceramic low-resistivity layer other than the high-resistivity layer,
the high-resistivity layer and the low-resistivity layer each contain Si, Mg, and Ti, and
the high-resistivity layer has higher Mg and Ti contents and a higher volume resistivity than the low-resistivity layer.

In this ceramic heater, the AlN ceramic substrate includes an AlN ceramic high-resistivity layer disposed between the plasma-generation electrode and the heater electrode, and an AlN ceramic low-resistivity layer other than the high resistivity layer. The high-resistivity layer and the low-resistivity layer each contain Si, Mg, and Ti. The high-resistivity layer has higher Mg and Ti contents and a higher volume resistivity than the low-resistivity layer. Thus, passage of a leakage current between the plasma-generation electrode and the heater electrode is prevented by the high-resistivity layer. The high-resistivity layer has relatively high Mg and Ti contents in order to have a higher volume resistivity than the low-resistivity layer. The high-resistivity layer and the low-resistivity layer constituting the AlN ceramic substrate are each basically formed of AlN ceramic and hence are not very different from each other in the thermal expansion coefficients. Thus, even repeated increase and decrease in the temperature of the ceramic heater is less likely to cause separation between the high-resistivity layer and the low-resistivity layer. Therefore, this ceramic heater prevents the leakage current between the plasma-generation electrode and the heater electrode for a long term.

In the ceramic heater according to the present invention, preferably, the high-resistivity layer has a lower Si content than the low-resistivity layer.

In the ceramic heater according to the present invention, preferably, the low-resistivity layer is an AlN ceramic layer containing 10 mass ppm or more and 50 mass ppm or less of Ti, and the high-resistivity layer is an AlN ceramic layer containing 1000 mass ppm or more and 1500 mass ppm or less of Ti. In this case, the high-resistivity layer has a volume resistivity higher than the volume resistivity of the low-resistivity layer, and the high-resistivity layer has a thermal conductivity similar to the thermal conductivity of the low-resistivity layer.

In the ceramic heater according to the present invention, preferably, the low-resistivity layer is an AlN ceramic layer containing 90 mass ppm or more and 180 mass ppm or less of Mg, and the high-resistivity layer is an AlN ceramic layer containing 200 mass ppm or more and 400 mass ppm or less of Mg.

In the ceramic heater according to the present invention, preferably, the high-resistivity layer has a volume resistivity 1.2 or more times a volume resistivity of the low-resistivity layer. In this case, the leakage current between the plasma-generation electrode and the heater electrode is more likely prevented.

In the ceramic heater according to the present invention, preferably, the high-resistivity layer has a thermal conductivity that is 90% or more of a thermal conductivity of the low-resistivity layer. In this case, the high-resistivity layer has a relatively high thermal conductivity, to thereby provide highly uniform heating for the wafer.

In the ceramic heater according to the present invention, preferably, the AlN ceramic substrate has a three-layer structure in which the low-resistivity layer, the high-resistivity layer, and the low-resistivity layer are stacked in this order, and the high-resistivity layer has a thickness smaller than a total thickness of the two low-resistivity layers. In general, a ceramic that has a high volume resistivity tends to have a low thermal conductivity, however, the structure employed has, as a whole, relatively high thermal conductivity to provide highly uniform heating for the wafer.

DETAILED DESCRIPTION OF THE INVENTION

Figure 1:
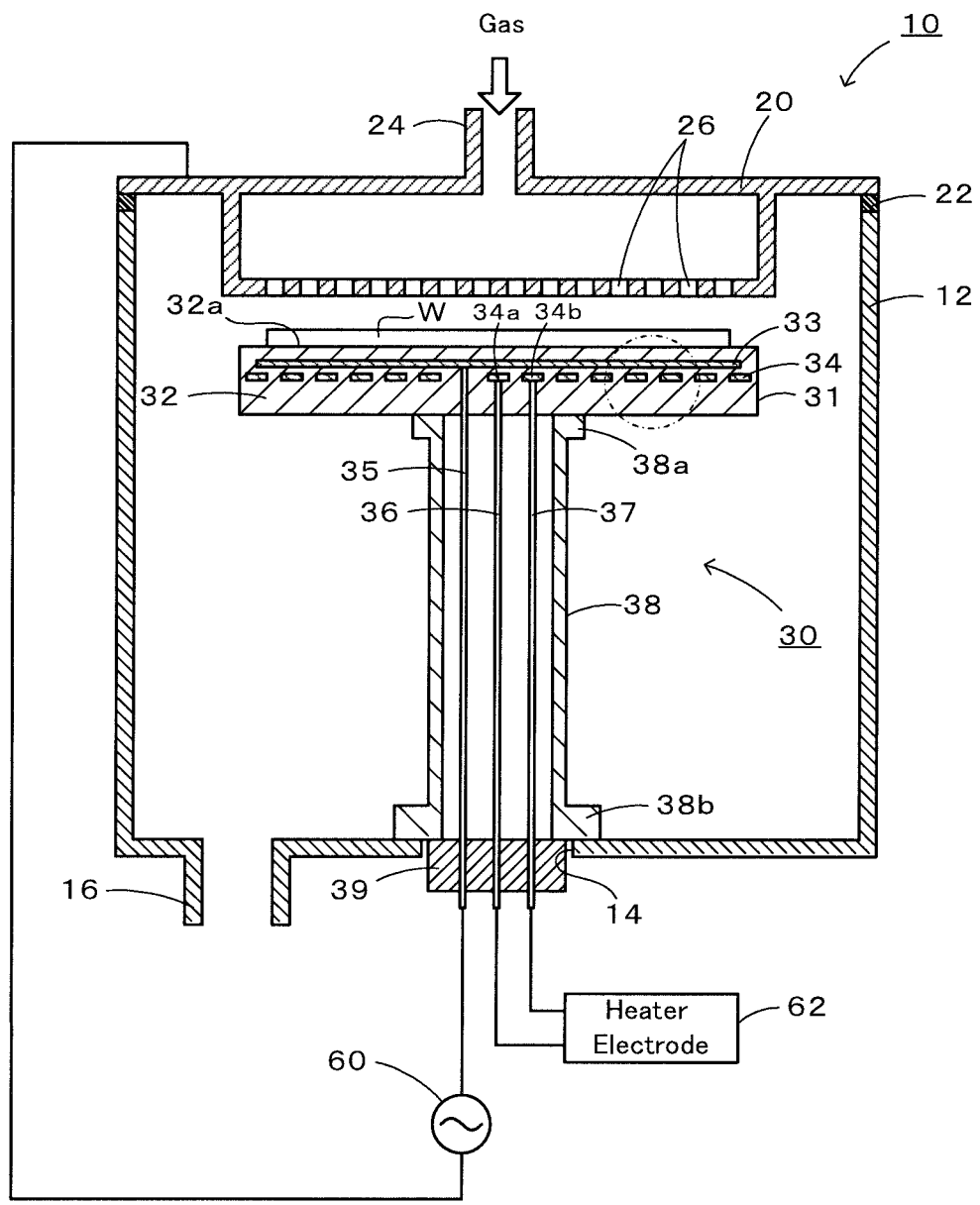
FIG. 1 is a sectional view illustrating the schematic configuration of a plasma treatment apparatus 10.
Figure 2:
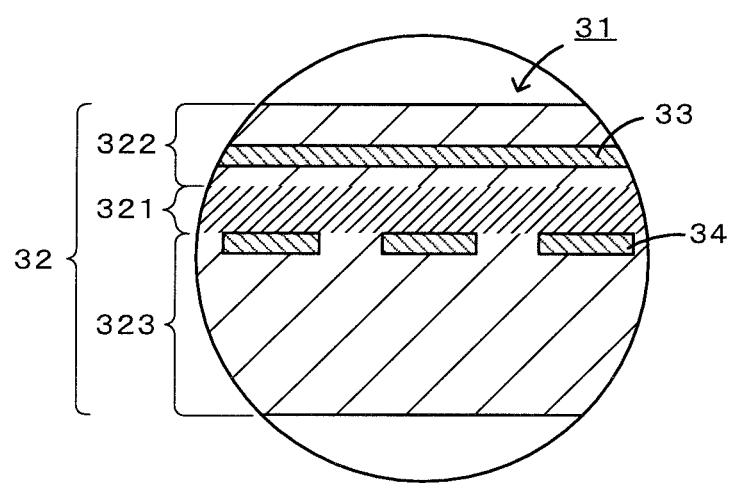
FIG. 2 is an enlarged view of a circular region defined by the dashed dotted line in FIG. 1.

Hereinafter, preferred embodiments according to the present invention will be described with reference to drawings. FIG. 1 is a sectional view illustrating the schematic configuration of a plasma treatment apparatus 10 and FIG. 2 is an enlarged view of the circular region defined by the dashed dotted line in FIG. 1.

As illustrated in FIG. 1, the plasma treatment apparatus 10 includes a chamber 12, a shower head 20, and a wafer placement device 30.

The chamber 12 is a container formed of, for example, an aluminum alloy to have a box shape. This chamber 12 has a round hole 14 in the substantial center of the bottom surface. The chamber 12 also has an exhaust duct 16 in the bottom surface. The exhaust duct 16 has, in an intermediate position, a pressure regulation valve or a vacuum pump (not shown) for regulation to the desired internal pressure of the chamber 12. The chamber 12 has an open top.

The shower head 20 is attached so as to cover the open top of the chamber 12. An insulating member 22 is disposed between the brim of the open top of the chamber 12 and the shower head 20. The shower head 20 covers the opening of the chamber 12 so as to provide a hermetic seal. The shower head 20 is configured to inject a gas introduced through a gas introduction duct 24, through a large number of gas injection holes 26 toward a wafer W placed on the ceramic heater 31. To the shower head 20, a plasma-generation RF power supply 60 is connected. Thus, the shower head 20 functions as a plasma-generation electrode. The frequency of the RF power supply 60 is preferably, for example, 13 MHz or 27 MHz.

The wafer placement device 30 includes a ceramic heater 31 and a hollow shaft 38.

The ceramic heater 31 includes a disc-shaped AlN ceramic substrate 32 having a wafer placement surface 32a in which, from a position closer to the wafer placement surface 32a, a plasma-generation RF electrode 33 and a heater electrode 34 are embedded in this order so as to be separated from each other.

As illustrated in FIG. 2, the AlN ceramic substrate 32 includes an AlN ceramic high-resistivity layer 321 disposed between the RF electrode 33 and the heater electrode 34, and AlN ceramic low-resistivity layers 322 and 323 other than the high-resistivity layer 321. The high-resistivity layer 321 and the low-resistivity layers 322 and 323 each contain Si, Mg, and Ti. In this case, the AlN ceramic substrate 32 has a three-layer structure in which the low-resistivity layer 322, the high-resistivity layer 321, and the low-resistivity layer 323 are stacked in this order, and the high-resistivity layer 321 has a thickness smaller than the total thickness of the two low-resistivity layers 322 and 323. The high-resistivity layer 321 has higher Mg and Ti contents and a higher volume resistivity than the low-resistivity layers 322 and 323. The high-resistivity layer 321 has a higher Ti content than the low-resistivity layers 322 and 323 and hence has a dark appearance. The high-resistivity layer 321 preferably has a lower Si content than the low-resistivity layers 322 and 323. The low-resistivity layers 322 and 323 are preferably AlN ceramic layers containing 10 mass ppm or more and 50 mass ppm or less of Ti; the high-resistivity layer 321 is preferably an AlN ceramic layer containing 1000 mass ppm or more and 1500 mass ppm or less of Ti. The low-resistivity layers 322 and 323 are preferably AlN ceramic layers containing 90 mass ppm or more and 180 mass ppm or less of Mg; the high-resistivity layer 321 is preferably an AlN ceramic layer containing 200 mass ppm or more and 400 mass ppm or less of Mg. The high-resistivity layer 321 preferably has a volume resistivity 1.2 or more times the volume resistivity of the low-resistivity layers 322 and 323; the high-resistivity layer 321 preferably has a thermal conductivity that is 90% or more of the thermal conductivity of the low-resistivity layers 322 and 323. The high-resistivity layer 321 preferably has thermal expansion coefficient $\alpha 1$ similar to thermal expansion coefficient $\alpha 2$ of the low-resistivity layers 322 and 323 (for example, in the range of $\alpha 2 \pm 10\%$, preferably in the range of $\alpha 2 \pm 5\%$).

The RF electrode 33 has a mesh shape, a plate shape, or a film shape, and is formed of, for example, a material mainly containing a simple substance or compound (such as carbide) of W, Mo, Ti, Si, or Ni, a material of a combination of the foregoing, or a mixed material of the foregoing and a ceramic raw material used for the ceramic substrate 32. The RF electrode 33 is connected, through a feeder rod 35 inserted through a surface (back surface) of the ceramic substrate 32 opposite from the wafer placement surface 32a, to the plasma-generation RF power supply 60.

The heater electrode 34 has a coil shape or a ribbon shape, and is formed of, for example, a material mainly containing a simple substance or compound (such as carbide) of W, Mo, Ti, Si, or Ni, a material of a combination of the foregoing, or a mixed material of the foregoing and a ceramic raw material used for the ceramic substrate 32. The heater electrode 34 is disposed in a one-stroke pattern from one end 34a to the other end 34b so as to cover the whole wafer placement surface 32a. To the one end 34a and the other end 34b of the heater electrode 34, feeder rods 36 and 37 are respectively connected. The two feeder rods 36 and 37 are connected together via a heater power supply 62. The heater electrode 34, upon supply of electric power from the heater power supply 62, heats the wafer W suctioned and held on the wafer placement surface 32a.

The hollow shaft 38 is formed of AlN as in the ceramic substrate 32 and has, around the openings at both ends, flanges 38a and 38b. The hollow shaft 38 is bonded, using the flange 38a at one end, to the back surface of the ceramic substrate 32 by diffusion bonding or TCB (Thermal compression bonding). TCB is a publicly known method in which a metal bonding material is placed between two members to be bonded together and, under heating at a temperature equal to or lower than the solidus temperature of the metal bonding material, the two members are press-bonded together. Incidentally, in the case of low usage temperatures, the hollow shaft 38 may be bonded, using an organic adhesive layer, to the back surface of the ceramic substrate 32. The hollow shaft 38 is also hermetically attached, using the flange 38b at the other end, around the round hole 14 formed in the bottom surface of the chamber 12. Thus, the inside of the hollow shaft 38 is completely separated from the inside of the chamber 12. The back surface of the flange 38b of the hollow shaft 38 is fitted with a rod fixing unit 39. The rod fixing unit 39 fixes, using clamp mechanisms (not shown), the feeder rods 35, 36, and 37 extending therethrough.

Hereinafter, a production example of the plasma treatment apparatus 10 will be described. Here, a production example of the wafer placement device 30 will be described. Note that this production example, which uses the well-known technique, will be concisely described. First, a mold having a flat cylindrical space is prepared. Into the mold, a low-resistivity-layer-forming raw material that is to be fired to form a low-resistivity layer is placed flatly. Subsequently, over this, the RF electrode 33 is placed, and furthermore the low-resistivity-layer-forming raw material is placed flatly over the RF electrode 33. Subsequently, over this, a high-resistivity-layer-forming raw material that is to be fired to form a high-resistivity layer is placed flatly, and preliminary molding into a disc shape is performed. Subsequently, over the high-resistivity-layer-forming raw material, the heater electrode 34 is placed, furthermore the low-resistivity-layer-forming raw material is placed flatly over the heater electrode 34, and molding into a disc shape is performed again. The obtained disc-shaped molded body is fired to obtain the ceramic heater 31. The firing may be performed by pressure firing (such as hot-press firing) or atmospheric firing. Subsequently, a surface of the ceramic heater 31 opposite from the wafer placement surface 32a is subjected to cutting such as formation of holes for connection of the feeder rods 35, 36, and 37. To the ceramic heater 31 having been subjected to cutting, the hollow shaft 38 separately prepared is bonded; subsequently, the feeder rod 35 is connected to the RF electrode 33 and the feeder rods 36 and 37 are connected to the one end 34a and the other end 34b of the heater electrode 34, to provide the wafer placement device 30.

Hereinafter, a usage example of the plasma treatment apparatus 10 will be described. As illustrated in FIG. 1, the plasma treatment apparatus 10 is placed within the chamber 12, and the wafer W is placed on the wafer placement surface 32a. Subsequently, a reactive gas is supplied through the shower head 20 such that the chamber 12 has a reactive gas atmosphere at a predetermined pressure (such as several tens to several hundreds of Pa). In this state, between the shower head 20 and the RF electrode 33 embedded in the ceramic substrate 32, a high-frequency power is supplied from the RF power supply 60. This causes generation of plasma between the parallel flat electrodes that are the shower head 20 and the RF electrode 33. The plasma is used to perform, on the wafer W, film formation by CVD or etching. On the basis of detection signals of a thermocouple (not shown), the temperature of the wafer W is determined; the voltage of the heater power supply 62 applied to the heater electrode 34 is controlled such that the temperature becomes the set temperature (such as 350° C. or 300° C.)

In the ceramic heater 31 having been described in detail so far, passage of a leakage current between the RF electrode 33 and the heater electrode 34 is prevented by the high-resistivity layer 321. The high-resistivity layer 321 has a relatively high Ti content so as to have a higher volume resistivity than the low-resistivity layers 322 and 323. In AlN ceramic, an excessively high Ti content results in a low volume resistivity, but an appropriate Ti content tends to result in a high volume resistivity. This embodiment uses this characteristic. The high-resistivity layer 321 and the low-resistivity layers 322 and 323 constituting the AlN ceramic substrate 32 are each basically formed of AlN ceramic, and hence are not very different from each other in the thermal expansion coefficients. Thus, repeated increase and decrease in the temperature of the ceramic heater 31 is less likely to cause separation between the high-resistivity layer 321 and the low-resistivity layers 322 and 323. Therefore, the ceramic heater 31 prevents the leakage current between the RF electrode 33 and the heater electrode 34 for a long term.

In the region around the RF electrode 33, changes with time in the RF magnetic field generated by the RF current flowing through the RF electrode 33 induce a RF electric field. The high-resistivity layer 321 prevents coupling of this RF electric field with the heater electrode 34. This sufficiently prevents the heater circuit including the heater electrode 34 from being affected by RF noise. As a result, the temperature of the heater electrode 34 can be controlled with high accuracy.

The high-resistivity layer 321 preferably has a lower Si content than the low-resistivity layers 322 and 323. In this case, as has been demonstrated by the measurement data in Experimental Examples described later, in spite of a high Ti content, a high resistivity can be provided. The low-resistivity layers 322 and 323 are preferably AlN ceramic layers containing 30 mass ppm or more and 120 mass ppm or less of Si; the high-resistivity layer 321 is preferably an AlN ceramic layer containing 20 mass ppm or more and 100 mass ppm or less of Si; the low-resistivity layers 322 and 323 preferably have a higher Si content than the high-resistivity layer 321.

The low-resistivity layers 322 and 323 are preferably AlN ceramic layers containing 10 mass ppm or more and 50 mass ppm or less of Ti, and the high-resistivity layer 321 is preferably an AlN ceramic layer containing 1000 mass ppm or more and 1500 mass ppm or less of Ti. In this case, the high-resistivity layer 321 has a volume resistivity higher than the volume resistivity of the low-resistivity layers 322 and 323, and the high-resistivity layer 321 has a thermal conductivity similar to the thermal conductivity of the low-resistivity layers 322 and 323.

The low-resistivity layers 322 and 323 are preferably AlN ceramic layers containing 90 mass ppm or more and 180 mass ppm or less of Mg, and the high-resistivity layer 321 is preferably an AlN ceramic layer containing 200 mass ppm or more and 400 mass ppm or less of Mg. In this case, as has been demonstrated by the measurement data in Experimental Examples described later, in spite of a high Ti content, a high resistivity can be provided.

Furthermore, the high-resistivity layer 321 preferably has a volume resistivity 1.2 or more times the volume resistivity of the low-resistivity layers 322 and 323. In this case, the leakage current between the RF electrode 33 and the heater electrode 34 is more likely prevented.

In addition, the high-resistivity layer 321 preferably has a thermal conductivity that is 90% or more of the thermal conductivity of the low-resistivity layers 322 and 323. In this case, the high-resistivity layer 321 has a relatively high thermal conductivity, to thereby provide highly uniform heating for the wafer W.

Furthermore, the AlN ceramic substrate 32 has a three-layer structure in which the low-resistivity layer 322, the high-resistivity layer 321, and the low-resistivity layer 323 are stacked in this order, and the high-resistivity layer 321 has a thickness smaller than the total thickness of the two low-resistivity layers 322 and 323. In general, a ceramic that has a high volume resistivity tends to have a low thermal conductivity; however, the structure employed has, as a whole, relatively high thermal conductivity, to provide highly uniform heating for the wafer W.

It is appreciated that the present invention is not limited to the above-described embodiments at all, and can be carried out in various embodiments without departing from the technical scope of the present invention.

Figure 3:
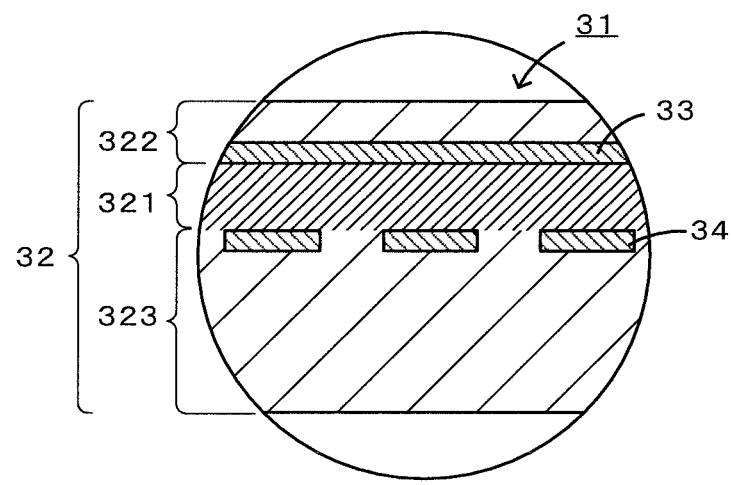
FIG. 3 is an enlarged view of a circular region according to another embodiment.
Figure 4:
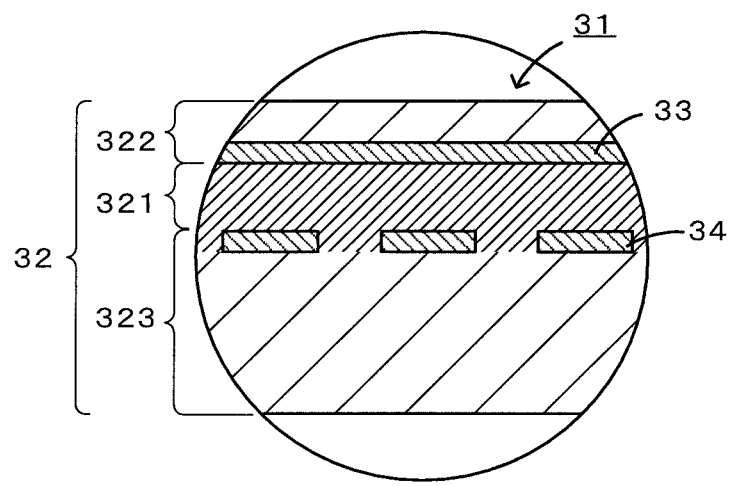
FIG. 4 is an enlarged view of a circular region according to another embodiment.

For example, in the above-described embodiment, the high-resistivity layer 321 is disposed below the lower surface of the RF electrode 33 and in contact with the upper surface of the heater electrode 34; however, this is a non-limiting example. For example, as illustrated in FIG. 3, the high-resistivity layer 321 may be disposed in contact with the lower surface of the RF electrode 33 and the upper surface of the heater electrode 34. Alternatively, at least one of the RF electrode 33 or the heater electrode 34 may be embedded within the high-resistivity layer 321. An example in which the heater electrode 34 is embedded within the high-resistivity layer 321 is illustrated in FIG. 4. In FIG. 3 and FIG. 4, the same elements as in the above-described embodiment are denoted by like reference signs. In these cases, the same advantages as in the above-described embodiment are provided.

In the above-described embodiments, the wafer placement surface 32a may be divided into a plurality of zones and the heater electrode 34 may be disposed in each of the zones.

In the above-described embodiments, an electrostatic electrode may be disposed within the AlN ceramic substrate 32, and the wafer W may be electrostatically suctioned to the wafer placement surface 32a.

EXAMPLES

In accordance with the above-described production example of the ceramic heater 31 in the embodiment, four ceramic heaters 31 were produced (Experimental Examples 1 to 4), and the AlN ceramic substrates 32 were evaluated in terms of Ti content and properties. The results are described in Table 1. The Si, Mg, and Ti contents were determined by ICP atomic emission spectroscopy (ICP-AES). The values of volume resistivity were measured at room temperature and determined in accordance with JIS-C2141. The values of thermal conductivity were measured at room temperature and determined in accordance with JIS-R1611. The values of thermal expansion coefficients were determined from room temperature to 1000° C. in accordance with JIS-R1618.

TABLE 1

|  | Experimental Example 1 | | Experimental Example 2 | | Experimental Example 3 | | Experimental Example 4 | |
| --- | --- | --- | --- | --- | --- | --- | --- | --- |
|  | Low-resistivity Layer | High-resistivity Layer | Low-resistivity Layer | High-resistivity Layer | Low-resistivity Layer | High-resistivity Layer | Low-resistivity Layer | High-resistivity Layer |
| Ti contained in AlN [mass ppm] | 34 | 1100 | 24 | 1200 | 27 | 1100 | 24 | 1200 |
| Si contained in AlN [mass ppm] | 91 | 61 | 34 | 20 | 120 | 91 | 33 | 20 |
| Mg contained in AlN [mass ppm] | 180 | 230 | 96 | 290 | 120 | 250 | 98 | 290 |
| Volume Resistivity [Ω·cm] | 5.9E+14 | 2.4E+15 | 5.9E+14 | 2.4E+15 | 1.4E+16 | 1.7E+16 | 1.4E+16 | 1.7E+16 |
| Thermal Conductivity [W/m·K] | 190 | 177 | 190 | 177 | 178 | 171 | 178 | 171 |
| Thermal Expansion Coefficient [ppm/°C.] | 5.9 | 5.6 | 5.9 | 5.6 | 5.5 | 5.6 | 5.5 | 5.6 |

In Experimental Examples 1 to 4, the high-resistivity layer 321 and the low-resistivity layers 322 and 323 each contained Si, Mg, and Ti, and the high-resistivity layer 321 had higher Mg and Ti contents, a higher volume resistivity, and a lower Si content than the low-resistivity layers 322 and 323. In each of Experimental Examples 1 to 4, the high-resistivity layer 321 and the low-resistivity layers 322 and 323 had substantially similar thermal expansion coefficients. In each of Experimental Examples 1 to 4, the high-resistivity layer 321 had a higher volume resistivity than the low-resistivity layers 322 and 323. In Experimental Examples 1 and 2, the high-resistivity layer 321 had a volume resistivity about 4 times the volume resistivity of the low-resistivity layers 322 and 323, and the high-resistivity layer 321 had a thermal conductivity that was about 93% of the thermal conductivity of the low-resistivity layers 322 and 323. In Experimental Examples 3 and 4, the high-resistivity layer 321 had a volume resistivity about 1.2 times the volume resistivity of the low-resistivity layers 322 and 323, and the high-resistivity layer 321 had a thermal conductivity that was about 96% of the thermal conductivity of the low-resistivity layers 322 and 323.

The present application claims priority from Japanese Patent Application No. 2019-049548, filed on Mar. 18, 2019, the entire contents of which are incorporated herein by reference.

What is claimed is:

1. A ceramic heater comprising an AlN ceramic substrate having a wafer placement surface in which, from a position closer to the wafer placement surface, a plasma-generation electrode and a heater electrode are embedded in this order so as to be separated from each other,
wherein the AlN ceramic substrate includes
an AlN ceramic high-resistivity layer disposed between the plasma-generation electrode and the heater electrode, and
an AlN ceramic low-resistivity layer other than the high-resistivity layer,
the high-resistivity layer and the low-resistivity layer each contain Si, Mg, and Ti, and
the high-resistivity layer has higher Mg and Ti contents and a higher volume resistivity than the low-resistivity layer.

2. The ceramic heater according to claim 1, wherein the high-resistivity layer has a lower Si content than the low-resistivity layer.

3. The ceramic heater according to claim 1, wherein the low-resistivity layer is an AlN ceramic layer containing 10 mass ppm or more and 50 mass ppm or less of Ti, and
the high-resistivity layer is an AlN ceramic layer containing 1000 mass ppm or more and 1500 mass ppm or less of Ti.

4. The ceramic heater according to claim 1, wherein the low-resistivity layer is an AlN ceramic layer containing 90 mass ppm or more and 180 mass ppm or less of Mg, and
the high-resistivity layer is an AlN ceramic layer containing 200 mass ppm or more and 400 mass ppm or less of Mg.

5. The ceramic heater according to claim 1, wherein the high-resistivity layer has a volume resistivity 1.2 or more times a volume resistivity of the low-resistivity layer.

6. The ceramic heater according to claim 1, wherein the high-resistivity layer has a thermal conductivity that is 90% or more of a thermal conductivity of the low-resistivity layer.

7. The ceramic heater according to claim 1, wherein the AlN ceramic substrate has a three-layer structure in which the low-resistivity layer, the high-resistivity layer, and the low-resistivity layer are stacked in this order, and the high-resistivity layer has a thickness smaller than a total thickness of the two low-resistivity layers.

* * * * *